United States Patent [19]
Cotter et al.

[11] Patent Number: 5,621,409
[45] Date of Patent: Apr. 15, 1997

[54] ANALOG-TO-DIGITAL CONVERSION WITH MULTIPLE CHARGE BALANCE CONVERSIONS

[75] Inventors: Martin G. Cotter, Co. Clare; Patrick J. Garavan, Limerick, both of Ireland

[73] Assignee: Analog Devices, Inc., Norwood, Mass.

[21] Appl. No.: 390,951

[22] Filed: Feb. 15, 1995

[51] Int. Cl.$^6$ ..................................................... H03M 1/12
[52] U.S. Cl. ........................... 341/156; 341/122; 341/172
[58] Field of Search ..................................... 341/141, 156, 341/158, 161, 162, 163, 172, 122

[56] References Cited

U.S. PATENT DOCUMENTS

| | | | |
|---|---|---|---|
| 3,286,232 | 11/1966 | Stanford | 340/146.2 |
| 3,988,689 | 10/1976 | Ochi et al. | 330/51 |
| 4,077,035 | 2/1978 | Yee | 340/347 DA |
| 4,129,863 | 12/1978 | Gray et al. | 340/347 AD |

(List continued on next page.)

FOREIGN PATENT DOCUMENTS

| | | |
|---|---|---|
| 0021650A1 | 1/1981 | European Pat. Off. . |
| 0064147 | 11/1982 | European Pat. Off. . |
| 0151469 | 8/1985 | European Pat. Off. . |
| 0151469A3 | 8/1985 | European Pat. Off. . |
| 0234034A1 | 9/1987 | European Pat. Off. . |
| 0281155A2 | 9/1988 | European Pat. Off. . |
| 3521224 | 6/1985 | Germany . |
| 53-42438 | 10/1979 | Japan . |
| 1402698 | 8/1975 | United Kingdom . |
| 1518558 | 7/1978 | United Kingdom . |
| 2008350 | 5/1979 | United Kingdom . |
| WO82/00390 | 2/1982 | WIPO . |
| WO93/19534 | 9/1993 | WIPO . |

OTHER PUBLICATIONS

Akazawa, Y. et al., "New Linearity Error Correction Technology for A/D and D/A Converter LSI", Japanese Journal of Applied Physics vol. 22 (1983) Supplement 22–1, pp. 115–119.

Allstot, D. J. et al., "An Electrically–Programmable Switched Capacitor Filter," IEEE J. Solid–State Circuits, vol. SC–14, No. 6, Dec. 1979, pp. 1034–1041.

Allstot, D. J., "A Precision Variable–Supply CMOS Comparator," IEEE Journal Solid–State Circuits, vol. SC–17, No. 6, pp. 1080–1087, Dec. 1982.

Analog Devices, Preliminary Technical Data, product #AD7882, Sep. 1993, pp. 1–12.

(List continued on next page.)

*Primary Examiner*—Howard L. Williams
*Attorney, Agent, or Firm*—Wolf, Greenfield & Sacks, P.C.

[57] ABSTRACT

Performing a coarse conversion of an analog signal to a coarse digital representation using a first analog-to-digital converter, transferring the coarse representation to a second converter, and performing a fine analog-to-digital conversion of the signal using the coarse representation as a starting value for a fine digital representation. The fine conversion can include a redundant portion that can be used to correct a mismatch between the coarse and fine conversions, and this correction can operate according to a combinatorial transfer function. The fine conversion may include switching from a coarse reference to a fine reference after transferring the coarse representation. The fine conversion can also include comparing an amount of charge in a sampling capacitor after performing the coarse conversion. Also disclosed is converting an analog signal to a digital representation having a first resolution level, adjusting a bandwidth of the converter circuit, and then continuing to convert the analog signal to a second, higher resolution level. The adjusting can include adjusting a bandwidth of a comparison circuit. Further disclosed is evaluating the amount of charge stored in a second sampling capacitor while tracking an analog signal with the first sampling capacitor. The amount of charge stored in the first capacitor is evaluated while tracking the signal with the second capacitor. Evaluating the amount of charge in the first capacitor can include comparing performed in part by a first comparator input stage, evaluating the amount of charge in the second capacitor can include comparing performed in part by a second comparator input stage. Analog-to-digital conversion circuitry can be multiplexed between the sampling capacitors.

51 Claims, 7 Drawing Sheets

U.S. PATENT DOCUMENTS

| | | | |
|---|---|---|---|
| 4,143,361 | 3/1979 | Tammes et al. | 340/347 CC |
| 4,144,527 | 3/1979 | Butler et al. | 341/347 AD |
| 4,180,807 | 12/1979 | Eichelberger et al. | 340/347 AD |
| 4,190,854 | 2/1980 | Redfern | 357/51 |
| 4,191,900 | 3/1980 | Redfern et al. | 307/355 |
| 4,222,107 | 9/1980 | Mrozowski et al. | 364/571 |
| 4,250,494 | 2/1981 | Butler et al. | 340/347 CC |
| 4,272,760 | 6/1981 | Prazak et al. | 340/347 CC |
| 4,295,089 | 10/1981 | Cooperman | 323/351 |
| 4,348,658 | 9/1982 | Carter | 340/347 AD |
| 4,350,975 | 9/1982 | Haque et al. | 341/172 |
| 4,399,426 | 8/1983 | Tan | 340/347 CC |
| 4,429,282 | 1/1984 | Saari | 330/9 |
| 4,439,693 | 3/1984 | Lucas et al. | 330/9 |
| 4,458,237 | 7/1984 | Domogalla | 340/347 AD |
| 4,517,549 | 5/1985 | Tsukakoshi | 340/347 AD |
| 4,542,354 | 9/1985 | Robinton et al. | 332/11 D |
| 4,543,953 | 10/1985 | Slocum et al. | 128/419 PT |
| 4,553,052 | 11/1985 | Takahashi | 307/494 |
| 4,555,668 | 11/1985 | Georgorian et al. | 330/9 |
| 4,563,654 | 1/1986 | Arai et al. | 330/277 |
| 4,577,228 | 3/1986 | Arai et al. | 358/167 |
| 4,620,179 | 10/1986 | Cooper et al. | 340/347 AD |
| 4,654,815 | 3/1987 | Marin et al. | 364/606 |
| 4,677,422 | 6/1987 | Naito | 341/122 |
| 4,700,174 | 10/1987 | Sutherland et al. | 340/347 CC |
| 4,709,225 | 11/1987 | Welland et al. | 340/347 CC |
| 4,777,451 | 10/1988 | Tohyama | 330/253 |
| 4,803,462 | 2/1989 | Hester et al. | 341/172 |
| 4,804,960 | 2/1989 | Fernandes et al. | 341/158 |
| 4,812,817 | 3/1989 | Bernard | 341/172 |
| 4,829,266 | 5/1989 | Pernici et al. | 330/253 |
| 4,831,381 | 5/1989 | Hester | 341/172 |
| 4,833,418 | 5/1989 | Quintus et al. | 330/9 |
| 4,881,044 | 11/1989 | Kinoshita et al. | 330/253 |
| 4,883,987 | 11/1989 | Fattaruso | 307/355 |
| 4,888,587 | 12/1989 | Kuraishi | 341/166 |
| 4,907,002 | 3/1990 | Kawada | 341/172 |
| 4,982,194 | 1/1991 | Bacrania et al. | 341/172 |
| 5,006,853 | 4/1991 | Kiriaki et al. | 341/156 |
| 5,014,055 | 5/1991 | Dingwall et al. | 341/159 |
| 5,016,014 | 5/1991 | Bitting | 341/162 |
| 5,036,322 | 7/1991 | Barrow et al. | 341/144 |
| 5,043,732 | 8/1991 | Robertson et al. | 341/156 |
| 5,047,665 | 9/1991 | Burt | 307/355 |
| 5,077,489 | 12/1991 | Gola et al. | 307/362 |
| 5,124,663 | 6/1992 | McEntarfer et al. | 330/9 |
| 5,138,319 | 8/1992 | Tesch | 341/156 |
| 5,184,130 | 2/1993 | Mangelsdorf | 341/156 |
| 5,220,206 | 6/1993 | Tsang et al. | 307/296.3 |
| 5,233,180 | 8/1993 | Tsuruta et al. | 250/208.1 |
| 5,235,333 | 8/1993 | Naylor et al. | 341/118 |
| 5,245,223 | 9/1993 | Lim et al. | 307/362 |
| 5,248,974 | 9/1993 | Fattaruso et al. | 341/172 |
| 5,272,395 | 12/1993 | Vincelette | 307/355 |
| 5,381,148 | 1/1995 | Mueck et al. | 341/139 |
| B1 4,399,426 | 7/1987 | Tan | 340/347 CC |

OTHER PUBLICATIONS

Beresford, R., "A self–calibration d–a converter," Electronics, Sep. 22, 1981, p. 144.

Bienstman, L. A., et al., "An 8–Channel 8b µP Compatible NMOS Converter with Programmable Ranges," 1980 IEEE International Solid–State Circuits Conference, pp. 16–17.

Biensman, L. A., et al., "An Eight–Channel 8 Bit Microprocessor Compatible NMOS D/A Converter with Programmable Scaling," IEEE J. Solid–State Circuits, vol. SC–15, No. 6, Dec. 1980, pp. 1051–1058.

Bon, M. et al., "All–Symbolic Analysis Technique for Multiphase Switched Capacitor Networks," pp. 655–660.

Cooperman, M. et al., "Charge Redistribution Codec," J. Solid–State Circuits, vol. SC–16, No. 3, pp. 155–162, Jun. 1981.

Crystal Semiconductor Corporatyion, "16–Bit, 100 hKz Serial–Output A/D Converter", Preliminary Product Information, DS45PP2, Jan. 1989, pp. B–95 –B115.

Dannenberg, R. E., "Closed Loop Digital–to–Analog Conversion," IBM Technical Disclosure Bulletin, vol. 20, No. 6, pp. 2332–2333, Nov. 1977.

De wit, M. et al., "A Low–Power 12–b Analog–to–Digital Converter with On–Chip Precision Trimming," IEEE J. of Solid–State Circuits, vol. 28, No. 4, Apr. 1993, pp. 455–461.

Dobberstein, E. A., "Auto–Preregulation Converter with Surge Control," IBM Technical Disclosure Bulletin, vol. 23, No. 8, pp. 3556–3558, Jan. 1981.

Eriksson, S., "Realiztion of Synchronous Wave Switched––Capacitor Filters," Dept. of Electrical Eng., Linköping University, Linköping, Sweden, pp. 650–654.

Fiedler, H. L. et al., "A 5–Bit Building Block for 20 Mhz A/D Converters," IEEE J. Solid–State Circuits, vol. SC–16, No. 3, pp. 151–155, Jun. 1981.

Fotouhi, B., et al., "An NMOS 12b Monotonic 25 µs A/D Converter," 1979 IEEE International Solid–State Circuits Conference, pp. 186–187.

Fotouhi, B. et al., "High–Resolution A/D Conversion in MOS/LSI," IEEE J. Solid–State Circuits, vol. SC–14, No. 6, Dec. 1979, pp. 920–926.

Gheewala, T. R., "Parallel, Flux Redistribution D/A and A/D Converters," IBM Technical Disclosure Bulletin, vol. 20, No. 6, pp. 2480–2482, Nov. 1977.

gillis, M. A., et al., "Supply Tracking Digital–to–Analog Converter," IBM Technical Disclosure Bulletin, vol. 20, No. 11A, Apr. 1978, pp. 4507–4508.

Gegorian, R. et al., "Offset Free High–Resolution D/A Converter," American Microsystems, Inc., Santa Clara, CA,1980, pp. 316–319.

Georgrian, R., "High–resolution switched–capacitor D/A converter," Microelectronics Journal vol. 12, No. 2, 1981, pp. 10–13.

Georgorian, R, et al., "An Integrated Single–Chip PCM Voice Codec with Filters," IEEE J. Solid–State Circuits, vol. SC–16, No. 4, Aug. 1981, No. 322–333.

Hague et al., "Two Chip PCM Voice Codec with Filters," IEEE J. Solid–State Circuits, vol. SC–14, No. 6, Dec. 1979, pp. 963–964.

Hamade, A. R. et al., "A Single–Chip 8–Bit A/D Converter," IEEE J. Solid–State Circuits, Dec. 1976, vol. SC–11, No. 6, pp. 154–155.

Hampel, D. et al., "Application of Monolithic CMOS Switched–Capacitor Filters and Amplifiers for Signal Processing," IEEE Trans. on Communications, vol. COM–28, No. 10, Oct. 1980, pp. 1828–1831.

Herbst, D. et al., "Master–Slice SC Filters," Lehrstuhl Bauelemente der elektrotechnik, University of Dortmund, West Germany, pp. 639–643.

Holloway, L., "Elimination of Offset During Analog–to–Digital Conversion," IBM Technical Disclosure Bulletin, vol. 19, No. 3, Feb. 1977, pp. 3610–3611.

Hornak, T. et al., "A High Precision Component–Tolerant A/D Converter," IEEE J. Solid–State Circuits, vol. SC–10, No. 6, Dec. 1975, p. 386.

Iwata, A. et al., "Low Power PCM CODEC and Filter System," IEEE J. Solid–State Circuits, vol. SC–16, No. 2, Apr. 1981, pp. 73–79.

Kleine, U. et al., "Real–Time Programmable Unit–Element SC Filter for LPC Synthesis," Electronics Letters, Aug. 20, 1981, vol. 17, pp. 600–602.

Kurth, C. F. et al., "Two–Port Analysis of Cascaded Switched–Capacitor Networks," IEEE 1978.

Kurth, C. F., "Two–Port Analysis of SC Networks with Continuous Input Signals," The Bell System Technical Journal, vol. 59, No. 8, Oct. 1980, pp. 1297–1316.

Lee, H.S. et al., "Self–Calibration Technique for A/D Converters," IEEE Trans. on Circuits and Systems, vol. CAS–30, No. 3, Mar. 1983, pp. 188–190.

Lee, H. S. et al., "A Self–Calibration 12b 12 µs CMOS ADC," 1984 IEEE International Solid–State Circuits Conference, pp. 64–65, 319.

Lee, H. S. et al., "Accuracy Considerations in Self–Calibrating A/D Converters", IEEE Trans. on Circuits and Systems, vol. CAS–32, No. 6, Jun. 1985, pp. 590–597.

Lee, H. S. et al., "A Direct Error Calibration Technique for Two–Step Flash A/D Converters," IEEE Trans, Circuits Syst., vol. 36, No. 6, pp. 919–922, Jun. 1989.

Lueder, E. et al., "Equivalent Sampled Data Filter Structures and Some of Their Properties," IEEE 1978, pp. 752–755.

Maio, K. et al., "An Untrimmed D/A Converter with 14–Bit Resolution," J. Solid–State Circuits, vol. SC–16, No. 6, pp. 616–620, Dec. 1981.

McCreary, J. L. et al., "All–MOS Charge Redisribution Analog–to–Digital Conversion Techniques—Part I", IEEE J. Solid–State Circuits, SC–10, Dec. 1975, pp. 371–379.

McCreary, J. L. et al., "Presicion Capacitor Ratio Measurement Technique for Integrated Circuit Capacitor Arrays," IEEE Trans, on Instrumentation and Measurement, vol. IM–28, No. 1, Mar. 1979, pp. 11–17.

Pouiois, R. et al., "A Low Drift Fully Integrated MOSFET Operational Amplifier," IEEE Journal Solid–State Circuits, vol. SC–13, No. 4, Aug. 1978, pp. 499–503.

Pryce, D., "Self–Calibrating A/D Converters, Monolithic devices enhance accuracy and linearity," EDN, Jan. 20, 1992, pp. 53–64.

Rosenthal, L. A., "Improved Frequency Meter Circuit," IEEE Trans. on Instrumentation and Measurement, vol. IM–26, No. 4, Dec. 1977, p. 421.

Schulz, R. A. et al., "Analog–To–Digital Converter with Noise Rejection", IBM Technical Disclosure Bulletin, vol. 15, No. 6, Nov. 1972, p. 2007–2008.

Schweer, B. et al., "Synthesis and Analysis Programs for VIS–SC Filters," Lehrstuhl Bauelemente der Elektrotechnik, University of Dortmund. West Germany, pp. 644–648.

Suarez, R. E. et al., "All–MOS Charge Redistribution Analog–to–Digital Conversion Techniques –Part II," IEEE J. Solid–State Circuits, vol. SC–10, No. 6, Dec. 1975, pp. 379–384.

Tan, K. S., et al, "A 5V, 16b 10µs Differential CMOS ADC", 1990 IEEE International Solid State Circuits Conference, pp. 166–167.

Timko, M. P., "Circuit Techniques for Achieving High Speed–High Resolution A/D Conversion," IEEE J Solid–State Circuits, vol. SC–15, No. 6, Dec. 1980, pp. 1040–1050.

Tröster, g. et al., "Error Cancellation for Capacitor Arrays in A/D and D/A Converters," IEEE Trans Circuits Syst. vol. 35, No. 6, pp. 749–751, Jun. 1988.

Yamakido, K. et al., "A Single–Chip CMOS Filter/Codec," J. Solid–State Circuits, vol. SC–16, No. 4, Aug. 1981, pp. 302–307.

Yee, Y.S., "Adaptive Reference Voltage Adjustment for an Analog–to–Digital Converter", IBM Technical Disclosure Bulletin, vol. 19, No. 6, Nov. 1976, pp. 2360–2362.

Yee, Y.S. et al., "A Two–Stage Weighted Capacitor Network for D/A–A/D Conversion", IEEE J. Solid–State Circuits, vol. SC–14, No. 4, aug. 1979, pp. 778–781.

Analog Devices, 1992 Data Converter Reference Manual, product #AD682, 4–41 and 4–47 to 4–48.

Patent Abstract of Japan; Kazuo; 63–294132, Nov. 30, 1988.

| | | | |
|---|---|---|---|
| $b_0$ | | | $d_0$ |
| $b_1$ | | | $d_1$ |
| $b_2$ | | | $d_2$ |
| $b_3$ | | | $d_3$ |
| $b_4$ | | — | $d_4$ |
| $b_{5u}$ | $b_5$ | | $d_5$ |
| $b_6$ | | | $d_6$ |
| $b_7$ | | | $d_7$ |
| $b_8$ | | | $d_8$ |
| $b_9$ | | | $d_9$ |
| $b_{10}$ | | | $d_{10}$ |
| $b_{11}$ | | — | $d_{11}$ |
| $b_{12u}$ | $b_{12}$ | | $d_{12}$ |
| $b_{13}$ | | | $d_{13}$ |
| $b_{14}$ | | | $d_{14}$ |
| $b_{15}$ | | | $d_{15}$ |
| $b_{16}$ | | | $d_{16}$ |
| $b_{17}$ | | | $d_{17}$ |
| $b_{18}$ | | — | $d_{18}$ |
| + | + | — | ofi / ufi |

FIG. 5

ANALOG-TO-DIGITAL CONVERSION WITH MULTIPLE CHARGE BALANCE CONVERSIONS

CROSS-REFERENCE TO RELATED APPLICATIONS

This application is related to application Ser. No. 08/483,372, and application Ser. No. 08/475,631 both filed on Jun. 7, 1995 and now abandoned.

FIELD OF THE INVENTION

This invention relates to analog-to-digital converters and more particularly to charge redistribution analog-to-digital converters that perform an individual analog-to-digital conversion as a series of smaller, differing charge redistribution conversions.

BACKGROUND OF THE INVENTION

Analog-to-digital converters (ADC's) translate an analog signal into a digital representation of that signal. One type that can be manufactured using relatively inexpensive integrated circuit (IC) techniques is the charge redistribution (or charge balance) ADC. Generally, this sort of converter operates by first trapping a quantity of charge related to a voltage to be measured in a sampling capacitor, and then determining the amount of trapped charge using a capacitive ladder circuit. The ladder circuit typically includes a series of binary-weighted capacitors that each have a common plate connected to the sampling capacitor, with each capacitor in the ladder corresponding to a single bit of the converter. The smallest ladder capacitor corresponds to the least significant bit (LSB) of the converter, and the remaining capacitors are each twice as large as the last, with the largest one corresponding to the most significant bit (MSB) of the converter.

To determine the amount of charge trapped in the sampling capacitor, and hence the value of the voltage to be measured, charge redistribution converters usually switch the ladder capacitors one at a time between ground and a precise voltage reference. Each time the converter switches a ladder capacitor, the sampling capacitor and the ladder form different capacitive voltage divider between ground and the reference voltage, and the converter tests the output of that divider with a comparator. Depending on the result of the test, the converter leaves the tested capacitor connected either to the reference or to ground, and sets its corresponding bit to either a one or a zero. Once the converter has tested every ladder capacitor, it can provide the weighted sum of all of the corresponding bits on a digital output as a measure of the voltage.

Average 1/f noise levels generally impose a lower limit on the size of the MSB capacitor in a binary-weighted ladder in an ADC IC. Testing each of the most significant bits therefore typically involves large charge transfers from the reference, which can disturb the converter's reference voltage for a significant amount of time. Allowing the reference to stabilize between these tests can constrain the maximum speed of the ADC.

One approach to increasing the speed of charge redistribution converters is to successively approximate a certain number of a single converter's most significant bits at less than a desired accuracy, by decreasing settling time for these bits. An error correction stage can then be used to extend settling time permitted at each bit level, and erroneous output digits are corrected digitally. Such a system is presented in U.S. Pat. No. 4,620,179 entitled "Method for Successive Approximation A/D Conversion", to Cooper et al. Cooper et al. state that this approach provides a net savings, because even though the error correction stage adds time to overall conversion, time is saved from the most significant bits.

SUMMARY OF THE INVENTION

In one general aspect, the invention features performing a coarse conversion of an analog signal to a coarse digital representation using a first analog-to-digital converter, transferring the coarse representation to a second converter, and performing a fine analog-to-digital conversion of the signal using the coarse representation as a starting value for a fine digital representation. The fine conversion can include a redundant portion that can be used to correct a mismatch between the coarse and fine conversions, and this correction can operate according to a combinatorial transfer function. The fine conversion may include switching from a coarse reference to a fine reference after transferring the coarse representation. The fine conversion can also include comparing an amount of charge in a sampling capacitor after performing the coarse conversion.

In another general aspect, the invention features converting an analog signal to a digital representation having a first resolution level, adjusting a bandwidth of the converter circuit, and then continuing to convert the analog signal to a second, higher resolution level. The adjusting can include adjusting a bandwidth of a comparison circuit.

In another general aspect, the invention features evaluating the amount of charge stored in a second sampling capacitor while tracking an analog signal with a first sampling capacitor. The amount of charge stored in the first capacitor is evaluated while tracking the signal with the second capacitor. Evaluating the amount of charge in the first capacitor can include comparing performed in part by a first comparator input stage, evaluating the amount of charge in the second capacitor can include comparing performed in part by a second comparator input stage. Analog-to-digital conversion circuitry can be multiplexed between the sampling capacitors.

Circuitry designed in accordance with the invention is advantageous in that it allows charge redistribution ADC's to operate more quickly, more accurately, or both. Using a coarse conversion result from a converter made up of relatively small capacitors as a starting point for a fine conversion performed with a converter made up of larger capacitors allows grouping of the transient effects of switching the larger capacitors into a single charge transfer, instead of several charge transfers. The reference thus only has to recover from a single charge transfer, which it can do more quickly than it could from several charge transfers.

By switching between two reference smoothing capacitors after the one transfer, a coarse reference capacitor can absorb the transient effects from that transfer, without affecting charge stored in a fine reference capacitor. The undisturbed fine reference is therefore immediately available for tests of the remaining bits in the fine conversion, and this can allow for faster and more precise conversions. Alternatively, converters employing circuitry according to the invention may be able to achieve equivalent accuracy and performance to prior art converters using smaller, less expensive, external reference capacitors.

Using a coarse conversion result from a converter made up of relatively small capacitors as a starting point for a fine conversion performed with a converter made up of larger capacitors can also reduce the magnitude of the voltage differences tested during the fine conversion. This can reduce hysteresis in the input stage of the comparator in the fine converter, and thereby improve the accuracy of the converter.

Adjusting the bandwidth of the comparator part way through a conversion to decrease its bandwidth and thereby increase its signal-to-noise ratio can provide further performance improvements, by allowing small signals involved in testing the least significant bit capacitors to be measured more precisely. In addition, providing a pipelined architecture to the input of the converter can improve throughput by overlapping sample and test times of successive conversions.

BRIEF DESCRIPTION OF THE DRAWING

FIG. 5 is a table that defines the structure and operation of the correction circuit of the analog-to-digital converter circuit of FIG. 1;

DETAILED DESCRIPTION

Figure 1:
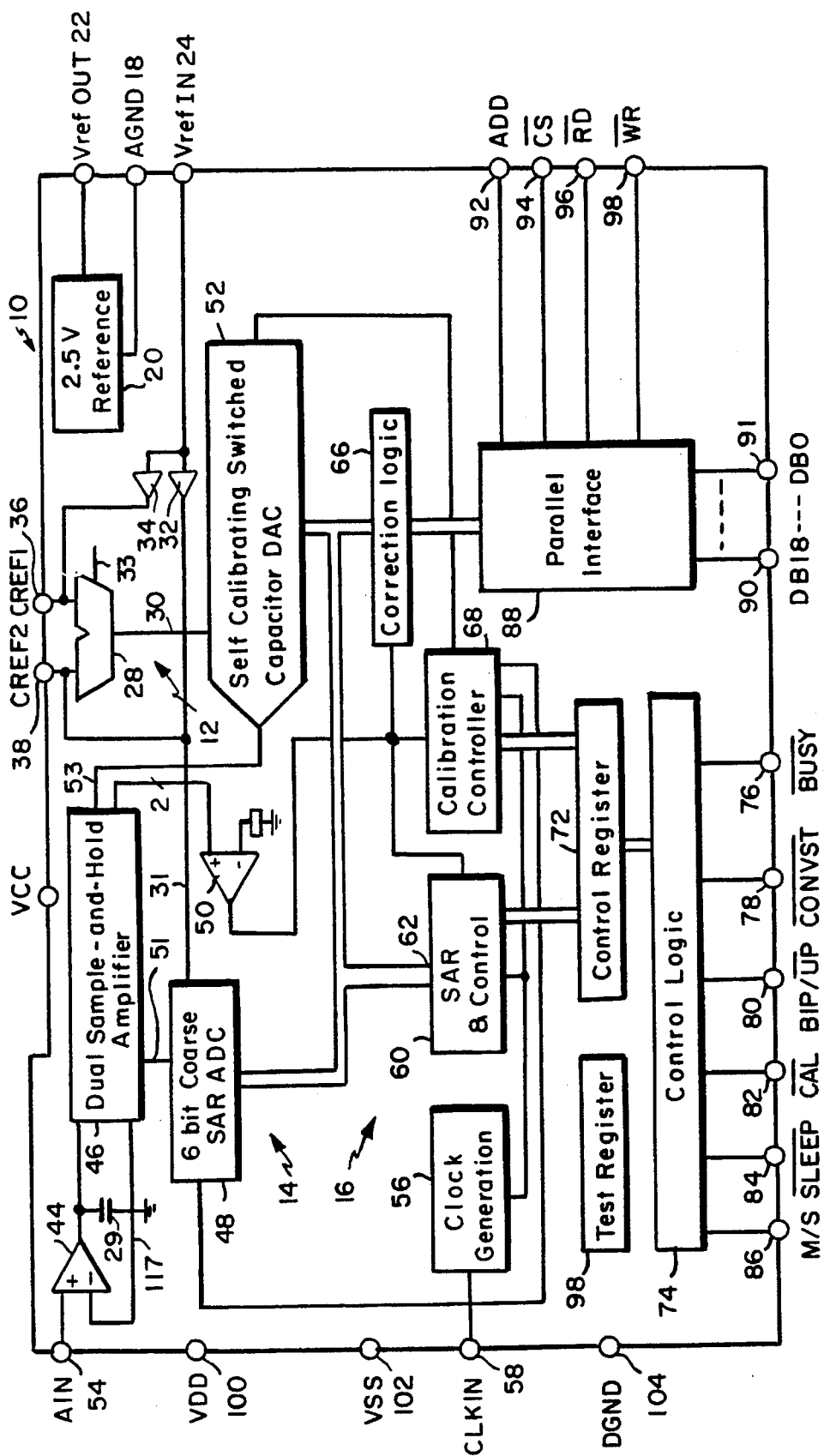
FIG. 1 is a simplified block diagram of an analog-to-digital converter integrated circuit employing conversion circuitry according to the invention.

Referring to FIG. 1, an example of an ADC IC 10 that employs conversion circuitry according to the invention includes a reference circuit 12, an analog acquisition and charge redistribution circuit 14, and a digital control and interface circuit 16. The reference circuit provides a reference voltage to the analog charge distribution circuit, which uses it as a standard in the conversion process. The digital control and interface circuit controls the operation of the converter and acts as a communications interface to a larger digital system, which may include a microprocessor (not shown). Portions of the ADC IC can be designed in accordance with teachings included in commonly-assigned copending applications entitled "LOW VOLTAGE CMOS COMPARATOR," filed Apr. 29, 1994 under Ser. No. 08/235,557; "LOW VOLTAGE CMOS ANALOG-TO-DIGITAL CONVERTER," filed Apr. 29, 1994 under Ser. No. 08/236,509; "CHARGE REDISTRIBUTION ANALOG-TO-DIGITAL CONVERTER WITH SYSTEM CALIBRATION," filed Apr. 29, 1994 under Ser. No. 08/235,087; and "POWER-UP CALIBRATION OF CHARGE REDISTRIBUTION ANALOG-TO-DIGITAL CONVERTER," filed Jan. 18, 1995 under Ser. No. 08/374,169, which are herein incorporated by reference.

Figures 3, 8:
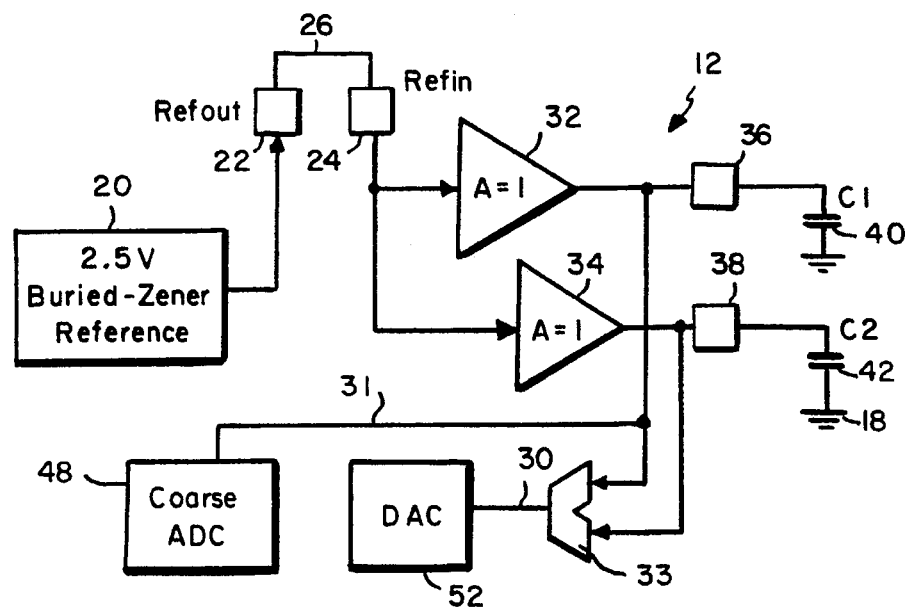
FIG. 3 is a diagrammatic circuit schematic of the reference circuit of the analog-to-digital converter circuit of FIG. 1.
FIG. 8 is a diagrammatic schematic diagram of portions of an alternative embodiment of an analog-to-digital converter integrated circuit employing conversion circuitry according to the invention.

Referring to FIGS. 1 and 3, the reference circuit 12 includes a voltage reference 20, such as an on-chip buried-zener reference. The voltage reference provides a relatively precise voltage on a voltage output, which is operatively connected to a reference out pin 22. To use this on-chip reference as a standard for conversions, a jumper 26 can tie a reference in pin 24 to the reference out pin. Alternatively, an external reference (not shown) can be used as a standard, by connecting it to the reference in pin and leaving the reference out pin unconnected.

The reference in pin 24 is operatively connected to an input of a coarse reference follower buffer 32 and to an input of a fine reference follower buffer 34. An output 31 of the coarse buffer is operatively connected to a coarse external reference smoothing capacitor pin 38, and to a reference input of a coarse ADC circuit 48. An output of the fine buffer is operatively connected to a fine external reference smoothing capacitor pin 36. The designer of the system employing the IC 10 generally provides a first external capacitor 40 (nominally 10 microfarad) between the coarse external capacitor pin and analog ground 18, and a second external capacitor 42 (nominally 1 microfarad) between the fine external capacitor pin and analog ground. These external capacitors should have a low internal inductance, and can be multilayer ceramic capacitors.

The reference circuit 12 also includes a reference conditioning circuit 28, which is an analog multiplexer circuit that has a coarse reference input operatively connected to the output 31 of the coarse buffer 32, and a fine reference input operatively connected to the output of the fine buffer 34. It has a reference output 30 operatively connected to a digital-to-analog converter (DAC) 52. The reference conditioning circuit also has a select input 33 operatively connected to the control and interface circuitry 16. It responds to a select signal on this select input by operatively connecting one of its reference inputs to its output.

Referring to FIG. 1, the analog acquisition and charge redistribution circuit 14 includes an input buffer 44 with a non-inverting input operatively connected to an analog input pin 54. An output of the input buffer is operatively connected to ground via a bandwidth limiting capacitor 29, and is also operatively connected to the input of a dual sample-and-hold (S/H) amplifier 46. The dual S/H amplifier has a first output 51 that is operatively connected to the coarse ADC 48.

Figure 2:
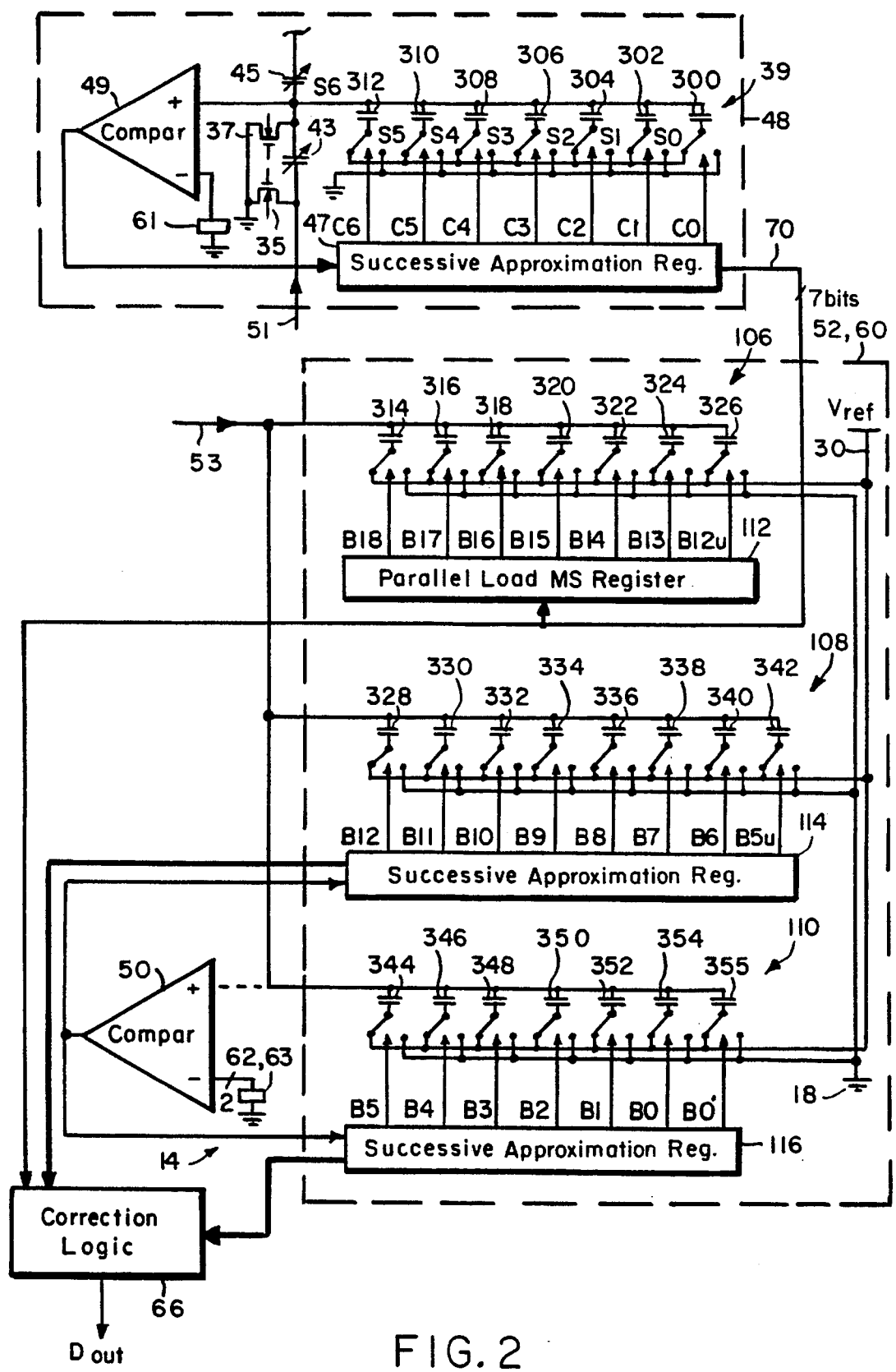
FIG. 2 is a diagrammatic circuit schematic of the charge balance conversion circuitry of the analog-to-digital converter circuit of FIG. 1, showing its relationship to the correction circuit of the analog-to-digital converter of FIG. 1.
Figure 4:
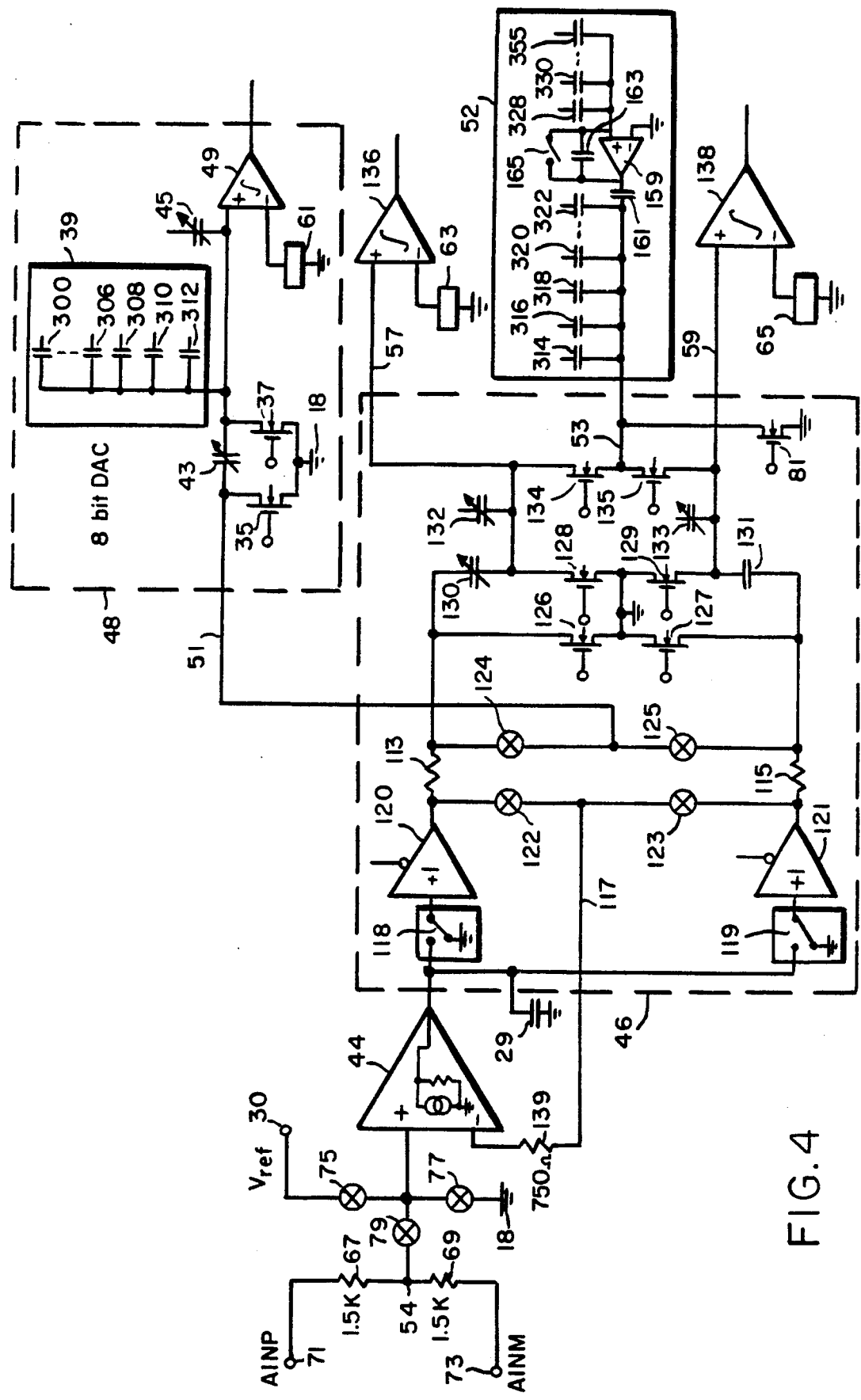
FIG. 4 is a diagrammatic circuit schematic of the signal acquisition circuit of the analog-to-digital converter circuit of FIG. 1, along with more diagrammatic representations of some of the other parts of the circuit of FIG. 1, which representations are included to show the relationship between the signal acquisition circuit and other parts of the circuit of FIG. 1.

Referring to FIGS. 2 and 4, the coarse ADC 48 can be a signed six-bit ADC, which includes a first capacitive ladder circuit 39 that has an array of seven capacitors 300, 302, 304, 306, 308, 310, 312. Each of the seven capacitors has one plate operatively connected to a non-inverting input of a first comparator 49, and another plate operatively connected to a common pole of one of a first set of seven respective single-pole, double-throw semiconductor switches S0–S6. A first "contact" of each of these switches is operatively connected to analog ground 18, and a second is operatively connected to the coarse reference buffer output 31. The switches are driven by respective outputs C0–C6 of a first, coarse successive approximation register (SAR) 47. A control input of the first SAR is operatively connected to an output of the first comparator.

The coarse ADC 48 also includes a coarse sampling capacitor 43, which has a first plate operatively connected to the first output 51 of the dual S/H amplifier 46 and a second plate operatively connected to the non-inverting input of the first comparator 49. A first coarse grounding switch 35 is operatively connected between the first plate of the coarse sampling capacitor and analog ground 18. A second coarse grounding switch 37 is operatively connected between the second plate of the coarse sampling capacitor and analog ground. A binary-weighted calibration array is operatively connected in parallel with the coarse sampling capacitor, and this calibration array can be switched in order to effectively vary the capacitance of the coarse sampling capacitor. An adjustable calibration capacitor 45 is operatively connected to the non-inverting input of the first comparator.

The dual S/H amplifier 46 also has a second output 53 that is operatively connected to the DAC 52. The DAC is a self-calibrating switched capacitor DAC (e.g., signed 18-bit). It includes a second switched capacitive ladder circuit 106, which has a second series of seven capacitors 314, 316, 318, 320, 322, 324, 326 that are much larger than those in the coarse ADC (e.g., the MSB capacitor of course ADC can be equal to 1.6 picofarads when that of the DAC is 50 picofarads). These seven capacitors include the sign capacitor and the six most significant bit capacitors of the DAC. They are operatively connected between the second output of the dual S/H amplifier, and either the reference conditioning circuit 28 output 30 or analog ground 18, under control of a second set of switches driven by respective outputs B18-B12u of a parallel load register 112. The parallel load register has the same number of bits as the coarse SAR 47, and it has parallel load inputs operatively connected to parallel conversion result outputs of the coarse SAR via a bus 70.

The DAC 52 also includes a third switched capacitive ladder circuit 108, which has a third series of eight capacitors 328, 330, 332, 334, 336, 338, 340, 342 operatively connected between the second output 53 of the dual S/H amplifier 46, and either the reference conditioning circuit 28 output 30 or analog ground 18, under control of a third set of switches driven by respective outputs B12-B5$u$ of a second SAR 114. The DAC further includes a fourth switched capacitive ladder circuit 110, which has a fourth series of seven capacitors 344, 346, 348, 350, 352, 354, 355 operatively connected between the first output 53 of the dual S/H amplifier, and either the reference conditioning circuit output or analog ground, under control of a fourth set of switches driven by respective outputs B5-B0 and B0' of a third SAR 116. The third capacitive ladder includes medium significance bit capacitors, and the fourth capacitive ladder includes least significant bit capacitors as well as an additional dummy LSB capacitor 355 for use in calibrating the DAC. The second and third SAR's have control inputs operatively connected to an output of a second comparator 50.

Figure 6:
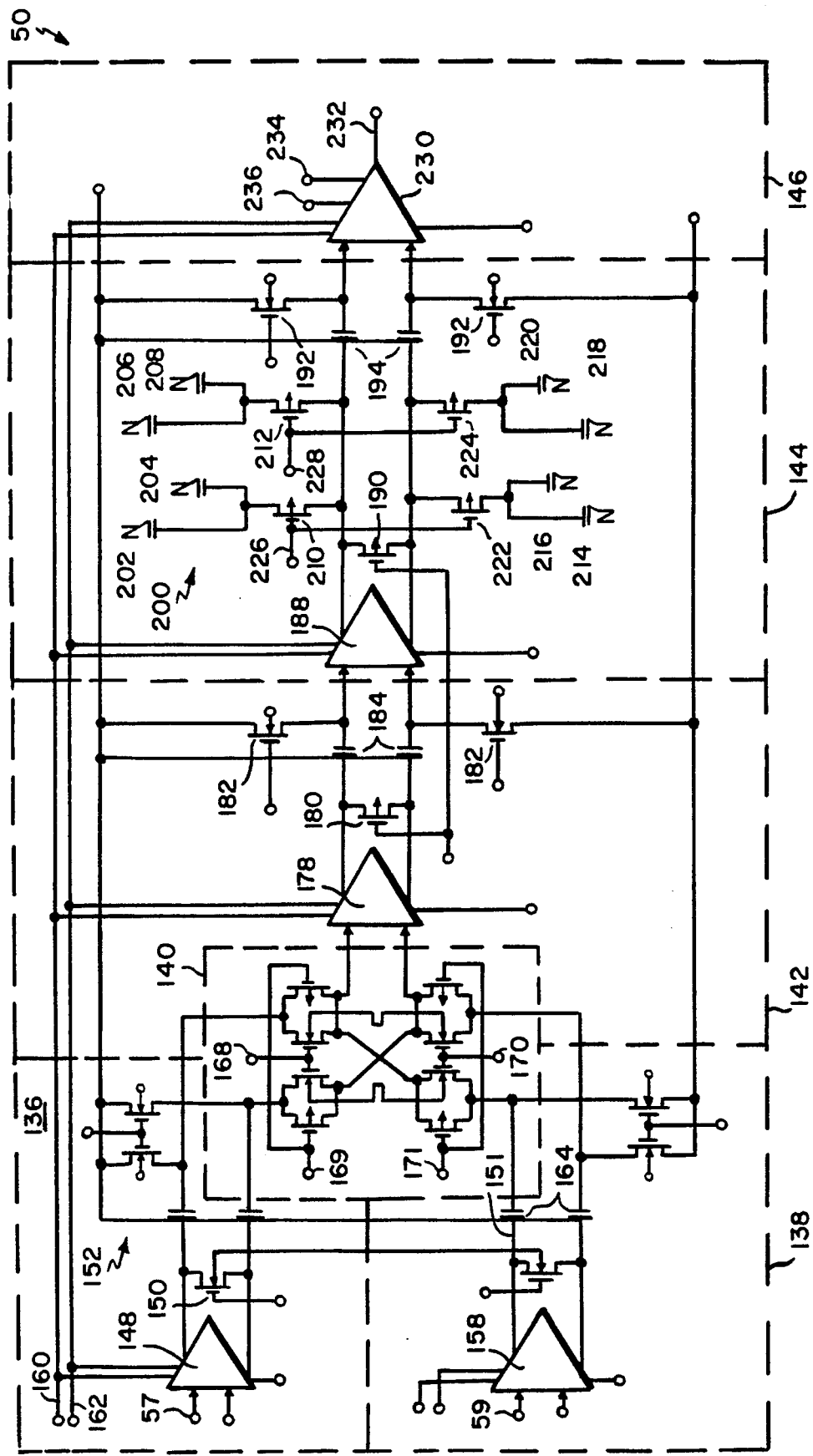
FIG. 6 is a diagrammatic circuit schematic of the second comparator of the analog-to-digital converter circuit of FIG. 1.

Referring to FIGS. 4 and 6, the dual S/H amplifier 46 also has a third output 57 operatively connected to a non-inverting input of a first channel input stage 136 of the second comparator 50, and a fourth output 59 operatively connected to a non-inverting input of a second channel input stage 138 of the second comparator. An inverting input of the first comparator 49 and inverting inputs of the first and second input stages are operatively connected to analog ground by respective dummy networks 61, 63, and 65.

The dummy networks 61, 63, and 65 each include a capacitor that has a capacitance chosen to match the aggregate capacitance at its respective non-inverting input. In parallel with each capacitor is a switch to match the aggregate switching resistance and offset at its respective non-inverting input. The dummy networks provide some first-order correction for switch offset, switch resistance, and capacitor leakage in the DAC 52 and ADC 48. The DAC will typically require a larger dummy network than the smaller coarse ADC, and this larger dummy network will take up more space on the integrated circuit. For this reason, in one embodiment, the switches in the dummy networks 63, 65 for the DAC are scaled to one third the size they should be for best matching, in order to reduce the amount of space they take up on the IC. The dummy network 61 for the coarse ADC 48 is not scaled in this embodiment.

Referring to FIG. 4, the dual S/H amplifier 46 has its input operatively connected to an input of a first channel follower buffer 120 via a first channel input switch 118, and to an input of a second channel follower buffer 121 via a second channel input switch 119. Each of the channel input switches can operatively connect the input of its respective follower buffer to either ground or to the input of the dual S/H amplifier. An output of the first follower buffer is operatively connected via a first feedback multiplexing switch 122 to a feedback node 117, and an output of the second follower buffer 121 is operatively connected via a second feedback multiplexing switch 123 to the feedback node. The feedback node forms an output of the dual amplifier and is operatively connected to an inverting input of the input buffer 44.

An offset canceling resistor 139 may be operatively connected between the feedback node 117 and the inverting input of the input buffer, depending on the input configuration of the ADC IC 10. In a non-differential configuration, the non-inverting input of the input buffer 44 can be operatively connected to the analog input pin 54. In this instance, little or no resistance is needed between the feedback node and the inverting input of the follower amplifier.

Alternatively, a differential approach can be used, in which a voltage divider is formed between a first input pin 71 and a second input pin 73. The divider includes a first divider resistor 67 (e.g., 1.5 k) and a second divider resistor 69 (e.g., 1.5 k), and has an output operatively connected to the non-inverting input of the input buffer 44. In this alternative approach, the offset cancelling resistor 132 should have a value equal to the resistance of the parallel combination of the first and second divider resistors (e.g., 750 ohms). By implementing the IC with an enhanced BiCMOS process (e.g., 2 micron), the divider resistors, offset cancelling resistor, and the input and reference buffers 44, 32, 34 can be provided on-chip.

For calibration purposes, a first calibration switch 79 can be provided between the analog input pin 54 (or pins 71, 73), which switch is capable of breaking the operative connection between the analog input pin and the input buffer. The non-inverting input of the input buffer 44 can then be operatively connected to the reference output 30 of the reference conditioning circuit 28 via a reference voltage calibration switch 75, or to analog ground 18 via a ground calibrating switch 77.

The output of the first follower buffer 120 is also operatively connected to an input of a first coarse ADC input multiplexing switch 124 via a first bandwidth limiting resistor 113. The output of the second follower buffer 121 is also operatively connected to an input of a second coarse ADC input multiplexing switch 125 via a second bandwidth limiting resistor 115. Outputs of the first and second coarse ADC input multiplexing switches are operatively connected to the first output 51 of the dual S/H amplifier 46.

A first plate of a first channel sampling capacitor 130 is operatively connected to a node between the first bandwidth limiting resistor 113 and the first coarse ADC input multiplexing switch 124. A first plate of a second channel sampling capacitor 131 is operatively connected to a node between the second bandwidth limiting resistor 115 and the second coarse ADC input multiplexing switch 125. A second plate of the first sampling capacitor is operatively connected to the third output 57 of the dual S/H amplifier 46, and a second plate of the second sampling capacitor is operatively connected to the fourth output 59 of the dual S/H amplifier. Respective calibration arrays are associated with the first and second sampling capacitors, so that the effective capacitance values of the sampling capacitors can be adjusted during calibration. The first and second sampling capacitors are "closely integrated" with the DAC 52, so that they remain well matched during operation.

A first channel one grounding switch 126 can operatively connect the first plate of the first sampling capacitor 130 to analog ground 18. A second channel one grounding switch 128 can operatively connect the second plate of the first sampling capacitor 130 to analog ground. A first channel two grounding switch 127 can operatively connect the first plate of the second sampling capacitor 131 to analog ground. A second channel two grounding switch 129 can operatively connect the second plate of the second sampling capacitor to analog ground. A first channel offset calibration capacitor 132 has its first plate operatively connected to the third output 57 of the dual S/H amplifier 46. A second channel offset calibration capacitor 133 has its first plate operatively connected to the fourth output 59 of the dual S/H amplifier. Each of these offset calibration capacitors represents an almost binary weighted array of capacitors whose second plates can be operatively connected either to analog ground or to the reference voltage during a calibration operation. The progression of the nominal values of these calibration capacitors is somewhat less than a binary progression, to leave some overlap in the arrays and thereby allow for some amount of error in the capacitors. Note that the MSB capacitors of these arrays are operatively connected to the reference voltage during conversion to achieve a bipolar calibration range.

A first channel DAC multiplexing switch 134 can operatively connect the second plate of the first sampling capacitor 130 to the second output 53 of the dual S/H amplifier 46. A second DAC multiplexing switch 135 can operatively connect the second plate of the second sampling capacitor 131 to the second output of the dual S/H amplifier. A reset grounding switch 81 can operatively connect the second output of the dual amplifier to analog ground 18.

As illustrated in the symbol designating the DAC 52 in FIG. 4, a scaling amplifier circuit 169 can be provided between two adjacent capacitors in the DAC (e.g., b7 and b6). By providing this scaling amplifier, the capacitors that are in less significant positions than the scaling amplifier can be made larger than they would otherwise have to be if the array was purely binary. This allows these capacitors to be made more precisely.

The scaling amplifier 169 includes an operational amplifier 159 with a non-inverting input operatively connected to the common plate of the capacitors (b6-b0 and b0') that are in a less significant position than it is. An inverting input of the operational amplifier is operatively connected to analog ground 18, and an output of the operational amplifier is operatively connected via an output capacitor 161 to the capacitors b18-b7 that are in a more significant position than it is. A parallel combination of a feedback capacitor 163 and a reset switch 165 operatively connects the operational amplifier input to its output.

The value of the output capacitor 161 is equal to that of the capacitor b7 that is next most significant with respect to the scaling amplifier 159. The value of the feedback capacitor 163 can be equal to the aggregate capacitance of the capacitors (b6-b0 and b0') that are in positions less significant than the scaling amplifier. To reduce the output range of the scaling amplifier, however, the feedback and output capacitors are made four times larger. In addition, for purposes of calibration, the feedback capacitor can be made somewhat smaller, to increase the gain of the scaling amplifier (e.g., to 106% of the scaling factor). This allows capacitors in more significant positions b18-b7 to be calibrated against capacitors in less significant positions (b6-b0 and b0') by adding a variable amount of capacitance to those in more significant positions, while also allowing optimum layout of the capacitors on both sides of the scaling amplifier. The coarse ADC 48 linearity may not need to be calibrated at all, because its output is corrected, as discussed below.

Referring to FIG. 1, the digital control and interface circuit 16 includes a clock generation circuit 56, which has a TTL-compatible input operatively connected to a clock input pin 58. Its output is operatively connected to a SAR and control circuit 60, a calibration controller 68, and to other parts of the IC where a clock signal is required. The SAR and control circuit includes the parallel load register 112, the second SAR 114, the third SAR 116, and control logic. It has an input operatively connected to the output of the second comparator 50, and a bidirectional port 62 operatively connected to the digital bus 70. The clock generation circuit also includes an internal oscillator, which is activated if the clock input pin is tied to ground.

The calibration controller 68 has a first input operatively connected to the output of the first comparator 49, and a second input operatively connected to the output of the second comparator 50. It also has a bidirectional port operatively connected to a first bidirectional port of a control register 72. The calibration controller controls calibration of the offset, gain, and linearity of the IC, including the coarse ADC 48 and the DAC 52. The above-referenced copending applications include some more detailed information about ADC calibration, although the principles of the invention could be applied to an IC that has no calibration circuitry at all.

The control register 72 further has a second port operatively connected to the SAR and control circuit 60, and a third port operatively connected to a control logic circuit 74. The control circuit is operatively connected to a busy status pin 76, which indicates converter status, and a conversion start input pin 78, which places the currently selected channel of the dual S/H amplifier 46 in hold mode and starts a conversion, if the IC 10 is configured for asynchronous operation. The control circuit is also operatively connected to a bipolar/unipolar select input 80, which selects either a bipolar input range (plus or minus the reference voltage) or a unipolar range (from analog ground to the reference voltage).

The control circuit is further operatively connected to a sleep input 84 that can power down all internal circuitry including the internal voltage reference, a calibration input 82 that resets all internal logic and initiates a calibration, and a dual-function mode/sync input 86. This dual-function input determines which calibration mode is to be used, when the device is in calibration mode. When the device is in normal operating mode, it determines whether conversion is synchronous or asynchronous. In synchronous operation the IC continuously converts the input in synchronism with the clock from the clock generation circuit 56. In asynchronous operation the IC converts the analog input in response to the application of a conversion start signal on the conversion start line 78.

A parallel interface 88 is operatively connected to the bus 70 via a correction logic circuit 66. The parallel interface is operatively connected to a chip select line 94, a read line 96, and a write line 98, which control reading from and writing to the IC from 19 bidirectional bus lines 90–91. The meaning and operation of these lines will be readily apparent to one skilled in the art.

The parallel interface 88 is also operatively connected to an address input line 92. This control input determines whether a word placed on the bus during a read operation is an ADC conversion result, or the contents of the control register 72. When writing to the IC 10, the address input determines whether the control register, or calibration data memory in the calibration controller 68 is the destination.

The control register 72, control circuit 74, and parallel interface 88 control the operation of the ADC IC 10 and allow it to communicate with external circuitry. These control and interface circuits can be implemented on-chip using conventional sequential digital logic design techniques, according to the desired operational characteristics described in this application. Such a design task is well within the abilities of one skilled in the art, and will not be discussed further, so as not to distract from the inventive teachings of this application.

The parallel interface 88 is further operatively connected to outputs of the correction circuit 66 via a 19-bit data input (dIS-d0). Inputs of the correction circuit are operatively connected to parallel outputs of the parallel load register 112 (b18-b12$u$), the second successive approximation register 114 (b12-b5$u$), and the third successive approximation register 116 (b5-b0). The correction circuit is a coinatorial logic circuit that includes addition and subtraction circuitry between its inputs and outputs. This combinatorial circuitry is designed according to FIG. 5, and can readily be implemented by one of skill in the art according to this figure and the following description.

FIG. 5 shows which of the input signals b18-b0 need to be added, and whether a binary "1" needs to be subtracted, in order to individually generate each of the outputs d18-d0 of the correction circuit. In particular, the correction circuit includes a subtraction circuit to subtract a binary one from b18. This subtraction corrects the converter output for bipolar operation when the IC 10 is in bipolar mode. Bits b17-b13 pass through the correction circuit, except that they are affected by carries and borrows from adjacent bit positions. An addition circuit adds the values of b12$u$ with b12 to obtain the output on the d12 line, and another subtraction circuit subtracts a binary one from the b11 line. Bits b10-b6 are passed through the circuit, with the exception that they are affected by carries and borrows. Another addition circuit adds the values of bits b5$u$ and b5 to obtain the d5 output. A further subtraction circuit subtracts a binary one from the b4 signal to obtain the d4 output signal. Finally, bits b3-b0 are affected only by borrows.

Referring to FIG. 6, the second comparator 50 includes the first channel input stage 136, the second channel input stage 138, and a multiplexing stage 140. The multiplexing stage has a first input operatively connected to an output of the first input stage, and a second input operatively connected to an output of the second input stage. An output of the multiplexer stage is operatively connected to an input of a second gain stage 142, and an output of the second gain stage is operatively connected to an input of a third gain stage 144. An output of the third gain stage is operatively connected to an input of a latching output stage 146. Each of these stages has a fully differential signal path.

The first input stage 136 includes a first amplifier 148, which has a pair of input lines forming a differential input for that stage. A non-inverting one of the input lines of the first stage 136 receives the third output 57 of the dual S/H amplifier 46. The first amplifier also has a pair of output lines, which form a differential output for the stage. A first reset device 150 can be provided between these output lines to decrease reset time for the comparator, as is known in the art. A first pair of offset memorization switches 152 and a first pair of offset memorization capacitors 154 are also provided at these output lines to memorize an output offset error of the amplifier, in a manner known in the art.

The second input stage 138 includes a second amplifier 158, which has a pair of input lines forming a differential input for that input stage. A non-inverting one of the input lines of the second input stage 138 receives the fourth output 59 of the dual amplifier. The second amplifier has a pair of output lines, which form a differential output for the stage. A second reset device 151 can be provided between these output lines to decrease reset time for the comparator, as is known in the art. The first pair of offset memorization switches 152 and a second pair of offset memorization capacitors 164 are also provided at these outputs to memorize an output offset error of the second amplifier, in a manner known in the art.

The multiplexing stage 140 acts as an analog double-pole, double-throw switch actuated by either a first channel select input 168 and its complement 169 or a second channel select input 170 and its complement 171. It selects between the differential output of the first channel input stage 136 and the differential output of the second channel input stage 138, and operatively connects the output of the selected input stage to a differential input of the second gain stage 142. The second gain stage 142 includes a third amplifier 178, which has first and second input lines that form the differential input to the stage. A third reset device 180 is operatively connected between two output lines of the amplifier. A second pair of offset memorization switches 182 and a third pair of offset memorization capacitors 184 are also provided at these output lines. The differential output of the third amplifier forms the output of the second gain stage, and is operatively connected to a differential input of the third gain stage 144.

The third gain stage includes a fourth amplifier 188, which has two input lines configured to form the differential input to the stage. The fourth amplifier has positive and negative output lines that can be operatively connected by a fourth reset device 190 and which form a differential output for the stage. A third pair of offset memorization switches 192 and a fourth pair of offset memorization capacitors 194 are provided at these outputs.

Also included in the third gain stage 144 is bandwidth adjustment circuitry 200. This bandwidth adjustment circuitry includes a first pair of parallel capacitors 202, 204 operatively connected between the IC substrate and a positive output line of the fourth amplifier 188 via a first bandwidth adjustment switch 210. It also includes a second pair of parallel capacitors 214, 216 operatively connected between the IC substrate and a negative output of the fourth amplifier via a second bandwidth adjustment switch 222.

The first and second bandwidth adjustment switches 210, 222 have their gates operatively connected to a first common control line 226.

This identical circuitry is repeated a second time. In particular, the bandwidth adjustment circuitry 200 includes a third pair of parallel capacitors 206, 208 operatively connected between the IC substrate and the positive output line of the fourth amplifier 188 via a third bandwidth adjustment switch 212. It also includes a fourth pair of capacitors 218, 220 operatively connected between the IC substrate and the negative output line of the fourth amplifier via a fourth bandwidth adjustment switch 224. The third and fourth bandwidth adjustment switches 212, 224 have their gates operatively connected to a second common control line 228.

The latching output stage 146 includes a latching amplifier 230 with input lines operatively connected to the output lines of the third gain stage 144. It also has latching control input lines 234, 236 that latch an output signal on a latched data output 232. Shutdown lines 160, 162 are provided to the amplifiers in the comparator, and respond to signals on the sleep pin 84, as is known in the art.

Figure 7:
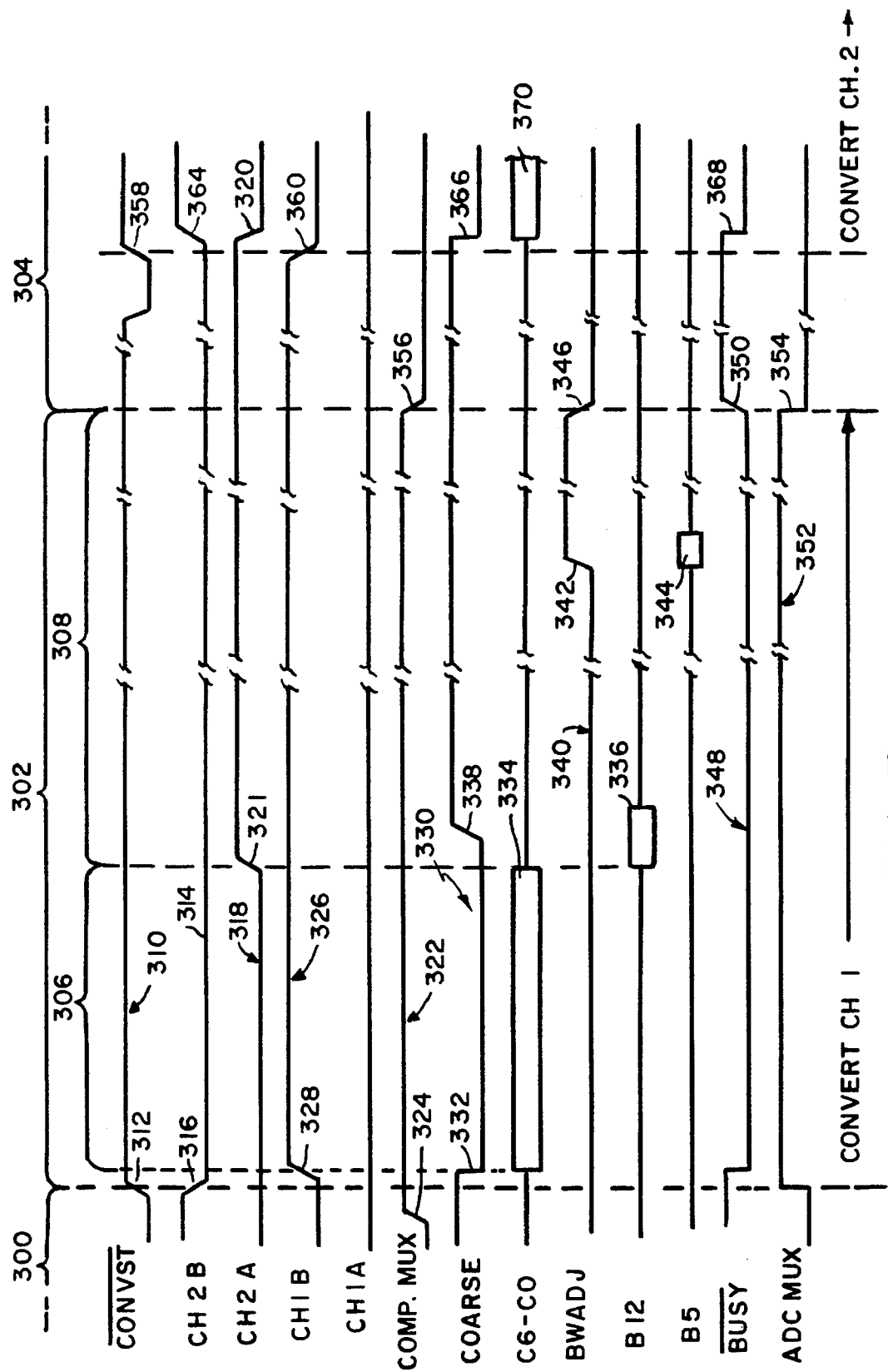
FIG. 7 is a diagrammatic timing diagram showing typical approximate timing for signals and operations of the analog-to-digital converter of FIG. 1.

In operation, referring to FIGS. 1, 4, and 7 the IC 10 performs conversions in two interleaved, or pipelined, phases 302, 304. During a first conversion phase 302, the voltage on the analog input pin 54 is operatively connected to the first channel follower buffer 120 by the first channel input switch 118, and the buffer charges the first channel sampling capacitor 130. Also during this first phase the first feedback multiplexing switch 122 operatively connects the output of the first channel follower buffer to the non-inverting input of the input buffer 44, so that the voltage at the first plate of the first channel sampling capacitor is driven to match the analog input voltage. At the same time, the analog acquisition and charge redistribution circuit 14 performs a conversion by testing the charge in the second sampling capacitor 131, which was charged during a previous phase 300.

At the beginning of the second conversion phase 304, the two sampling capacitors 130, 131 switch roles. The second sampling capacitor 131 tracks the input voltage instead of the first one 130, and the analog acquisition and charge redistribution circuit 14 begins performing a second conversion by testing the charge in the first sampling capacitor 130, which was charged during the first conversion phase 302.

This interleaved sampling of the analog input reference improves throughput of the converter, by performing sampling and conversion operations in parallel for successive conversions. Using this approach, the conversion circuitry may spend little or no idle time waiting for a sampling capacitor to be charged. This approach can also allow the sampling capacitor to be charged more fully, without impacting throughput, and this may improve the accuracy of the converter.

Referring to FIGS. 1–7, in preparation for the start of an asynchronous conversion, the control circuit 74 provides a low-to-high transition 324 on the second channel select signal 322 on the second channel select input 170, and a high-to-low transition (not shown) on its complement select input 171. This transition causes the output of the second channel input stage 138 to be operatively connected to the input of the second gain stage 142. This same high-to-low transition 324 is also presented to the second channel DAC multiplexing switch 135, which operatively connects the first plate of the second sampling capacitor 131 to the second output 53 of the dual S/H amplifier 46. After this transition, the zeroing, reset, and offset memorization switches 81, 150, 151, 165, 180, 182, 190, 192 are actuated to prepare the IC for a conversion. These allow D.C. offsets to be corrected, as is generally known in the art.

An asynchronous conversion begins when the conversion start line 78 receives a rising edge 312 on its input signal 310. The control circuit 74 responds to this edge 312 by providing a high-to-low transition 316 in the control signal 314 that drives the second channel two grounding switch 129, thereby opening that switch. This traps the charge in the second sampling capacitor 131. A short period (e.g., 50 nanoseconds) later, the control circuit 74 supplies a low-to-high transition 328 on the control signal 326 driving the second channel one grounding switch 128. This closes that switch, grounding the second plate of the first sampling capacitor 130, which causes the charge in the capacitor to begin tracking the voltage at the analog input 54.

At this point in time, the control circuit 74 also provides a high-to-low transition 332 in the select signal 330 on the select line 33 of the reference conditioning circuit 28. This transition causes the coarse external reference smoothing capacitor pin 36 to be operatively connected to the DAC 52. The coarse ADC 48 begins a low resolution (e.g., signed 6-bit) charge redistribution conversion, based on the charge in the second (coarse) reference capacitor 40 (period 306, signals 334). When this first coarse conversion period 306 ends, a fine conversion period 308 begins.

At the beginning of the fine conversion period 308, the control circuit 74 issues a control signal to the parallel load register 112 to latch in the results of the coarse conversion from the first successive approximation register 47. The control circuit also provides a low-to-high transition 321 on the control signal for the first channel two grounding switch 127. This grounds the first plate of the second sampling capacitor 131, which establishes the charge redistribution voltage divider condition between the sampling capacitor and the DAC 52 that allows the fine conversion to take place. By delaying this transition until the beginning of the fine conversion period, comparator hysteresis is reduced. This is because the parallel load register will be loaded with a code that is correct, or at least close to correct, and therefore the voltage at the non-inverting input of the second input stage 138 of the second comparator 50 will generally be much closer to the voltage at the inverting input would be if it were exposed to the individual switching of the MSB capacitors. MOS comparator input devices can otherwise exhibit threshold voltage hysteresis, which may increase necessary settling time or degrade resolution.

The fine conversion then begins with a test of the most significant bit b12 in the second successive approximation register 114 (signals 336). About half way through this test, the control circuit 74 toggles (edge 338) the signal 330 on the select input 33 of the reference conditioning circuit 28. This causes the reference voltage for the DAC to be switched from the coarse external reference smoothing capacitor pin 36 to the fine external reference smoothing capacitor pin 38. After the most significant bit b12 in the second SAR 114 has been tested, the remaining bits b11-b5u in the second SAR 114 are tested using charge from the second (fine) reference capacitor 42.

Because the highest order bits are preloaded in the parallel load register 112 from the coarse ADC 48, these bits do not need to be successively adjusted. This means that the most significant bit capacitors are all switched at once when the digital value is transferred from the coarse ADC, instead of being switched one at a time. The resulting large glitch can be mostly provided for by the first (coarse) capacitor 40 during the first half of the testing of the first bit b12 in the second SAR 114. Half-way through the testing of this bit b12, the reference conditioning circuit 28 operatively connects the second reference capacitor 42 to the DAC, so that the remaining tests can be performed using the second (fine) capacitor 130 to provide reference current, while the first capacitor is replenished. Switching the reference capacitors in this way reduces the impact of the charge transfer from the reference circuit 12 to the large capacitors on the accuracy of the IC 10. The first bit b12 in the second first successive approximation register 114 is redundant and compensates for the relatively lower accuracy of the coarse ADC 48, as discussed below.

At the end of the test of the least significant bit b5u in the second SAR 114, the control circuit 74 applies a low-to-high transition 342 on the control input signal 340 on one or both of the first and second common control lines 226, 228 of the bandwidth adjustment circuit 220. This causes the second comparator's bandwidth to decrease, and its signal-to-noise ratio to increase. Testing of the most significant bit b5 of the third SAR 116 then begins (signal 344). This test is followed by the testing of the remaining non-dummy bits b4-b0 in the third SAR 116. These tests last longer than those for the most significant capacitors.

Because the bandwidth of the second comparator 50 is reduced for the last bits of the conversion, it will be less sensitive to noise, and therefore more precise. For this reason, the most significant bit b5 in the third SAR 116 is redundant, and corrects for the less precise result from the medium significance bits in the second SAR 114, as discussed below. Because small voltage differences are measured in these final tests, the reduced bandwidth of the second comparator is adequate. The increased precision of the comparator is advantageous for the tests of the last bits, because these employ the comparator to perform comparisons of small voltages which tend to be sensitive to noise.

When the bandwidth of the comparator is to be adjusted, a high signal is provided on the first and/or second common control inputs 226, 228 of the bandwidth adjustment circuit 200. Actuating first control line 226 increases the capacitance on the outputs of the fourth amplifier 188 by operatively connecting the first pair of capacitors 202, 204 between the positive output line of the fourth amplifier and the substrate, and by operatively connecting the second pair of capacitors 214, 216 between the substrate and the negative output line of the fourth amplifier. The second control line 228 acts in a similar way, and can add further capacitance to the outputs of the amplifier. By providing two parts to the bandwidth adjustment circuit, the bandwidth can be set to four different levels. In one embodiment, these bits are not accessible to the user, but are accessible to the designer, allowing the designer to determine empirically after fabricating the integrated circuit, how much adjustment of the bandwidth results in optimum performance.

At the end of the fine conversion period 308, the control circuit 74 restores the bandwidth of the second comparator 50 to its higher level by deasserting (edge 346) the control signal applied to the common control lines 226, 228 of the bandwidth adjustment circuit 200. It also deasserts (edge 350) the busy signal 348 on the busy line 76. It further causes the channels to switch 354 as illustrated by the MUX control signal 352. The MUX control signal causes the first and second input buffer switches 118, 119, the first and second feedback multiplexing switches 122, 123, the first and second coarse ADC multiplexing switches 124, 125, and the first and second DAC multiplexing switches 134, 135 all to toggle. The select input signal 322 to the second channel select input 170 and its complement 171 are also toggled 356. Shortly thereafter, the first channel select input 168 and its complement 169 are toggled to cause the multiplexing stage 140 to select the output of the first channel input stage 136 to be operatively connected to the input of the second gain stage 142. With the various switches toggled in this way, the circuit is now ready to begin the second conversion phase 304 in which channel one is sampled and tested, and channel two tracks the analog input voltage.

Like the first conversion phase 302, the second conversion phase 304 begins with a rising edge 358 of the convert start signal 310 on the convert start line 78. Immediately following this rising edge, the control circuit 74 drives low the control signal 326 that controls the second channel one grounding switch 128 (edge 360). Shortly thereafter, the second channel two grounding switch 129 is driven high (edge 364), the control signal 330 on the select input 33 of the reference conditioning circuit 28 is driven low (edge 366), the busy signal 348 on the busy line 76 is driven low (edge 368), and a coarse conversion of the signal stored in the first sampling capacitor 128 (signals 370) begins. The coarse conversion proceeds much like the first conversion phase 302.

It is observed that the length of the tests for the various bits is different. The coarse tests of the bits b18-b12u in the first SAR 47 take the least time (e.g., 50 nanoseconds) because they are performed with relatively small capacitors and because the test of the first bit b12 of the second SAR 114 can correct some inaccuracy in these tests. The longest test is that of the first bit b12 in the second SAR 114 (e.g., 300 nanoseconds), which is to allow time for settling of the large glitch from the transfer of the coarse conversion value to the DAC 52 and the switching of the reference conditioning circuit 28. The remaining bits b11-b5u in the second SAR 114 take somewhat less time (e.g., 150 nanoseconds). The bits b5-b0 in the third SAR 116 take somewhat longer than those in the second SAR (e.g., 200 nanoseconds). Because of the correction at the first bit in the third SAR, the bits in the second SAR do not need to settle for as long as those in the third SAR (e.g., the bits in the second SAR can settle to 14-bit accuracy in an 18-bit converter IC).

Referring to FIG. 5, the correction circuit 66 performs arithmetic operations on the 21 bits (b18-b12u, b12-b5, and b5u-b0) obtained in the high resolution conversion operation. The result of these arithmetic operations is an 18-bit signed two's-complement output that is provided by the parallel interface 88 to the microprocessor. These arithmetic operations perform three adjustments to the output of the high resolution conversion:

The first adjustment is the subtraction of a binary one from the most significant bit result. This subtraction offsets the entire conversion result by one MSB, which changes the format of the digital output value from an unsigned integer value to a signed (bipolar) integer value. This function of the correction circuit can be made conditional on the bipolar/unipolar control input 80 of the control circuit 74, so that the part can be used in either a bipolar or unipolar mode. For this adjustment to work properly, the MSB capacitor is operatively connected to the reference voltage during sampling.

The second adjustment of the correction circuit 66 is to correct for the lower precision of the coarse ADC 48, relative to that of the DAC 52. It does this by adding the contents of the least significant bit b12u in the parallel load register 112, which is tested by the coarse ADC, with the contents of the (redundant) most significant bit b12 in the second SAR 114, which is more precisely determined by the DAC 52, and subtracting a binary one from bit b11. For this adjustment to work properly, the capacitor for the most significant bit b12 in the second SAR 114 is operatively connected to the reference voltage during sampling.

The third adjustment of the correction circuit 66 is to correct for the improved accuracy of the second comparator 50 in its lower bandwidth mode. It does this by adding the contents of the least significant bit b5$u$ in the second SAR, which is tested with the second comparator 50 in its higher bandwidth mode, with the contents of the (redundant) most significant bit b5 in the third SAR 116, which is tested more precisely with the second comparator in its lower bandwidth mode, and subtracting a binary one from bit b4. For this adjustment to work properly, the capacitor for the most significant bit b5 in the third SAR 116 is operatively connected to the reference voltage during sampling.

Referring to FIGS. 2, 4, and 6 the various calibration circuits in the ADC IC 10 are adjusted under control of the calibration controller 68 during initialization calibration routines. By calibrating the offset and gain of the coarse ADC 48 using the same input voltages that are used in calibrating the more precise DAC 52, the value transferred from the coarse successive approximation register 47 matches relatively well the value that the second switched capacitive latter circuit 106 would have derived.

Portions of an alternative embodiment of the invention are shown in FIG. 8. In this embodiment, the coarse ADC circuitry and much of the acquisition circuitry is the same as that presented for the embodiment of FIGS. 1–7. The embodiment of FIG. 8 is different primarily in that it employs a somewhat different DAC 400. This DAC has an additional amplifier 420 between a first capacitive ladder circuit 402 and the remaining capacitors in the DAC. The gain provided by the additional buffer reduces the precision requirement for the comparator 450, but requires a high quality amplifier. It also allows for the use of a single-input stage comparator, instead of one with multiplexed input stages.

More particularly, the DAC 400 includes a first capacitive ladder circuit 402 that includes an array of seven capacitors, which are operatively connected between the second output of the dual S/H amplifier 44, and either the reference conditioning circuit 28 output 30 or analog ground 18, under control of a second set of switches driven by respective outputs B18-B12$u$ of a parallel load register 112. The additional buffer 422 includes a first operational amplifier 422 having a non-inverting input operatively connected to the second output of the dual S/H amplifier, and an inverting input operatively connected to analog ground. A parallel combination of a feedback capacitor 424 and a zeroing switch 426 are provided between the non-inverting input of the operational amplifier and an output of the operational amplifier. The feedback capacitor can have a value that results in an amplifier gain of 64. The output of the operational amplifier is also operatively connected to a first plate of an output capacitor 428, which can have twice the capacitance of the capacitor 430 in the next least significant position.

The second plate of the output capacitor 428 is operatively connected to a non-inverting input of the comparator 450, and can be operatively connected to ground via a zeroing switch 454. It is also operatively connected to a first plate of the remaining capacitors in the DAC 400, either directly (430–431), or through a scaling amplifier 440 (432–434). A dummy network 452 can be operatively connected to the inverting terminal of the comparator.

While there have been shown and described what are at present considered the preferred embodiments of the present invention, these embodiments are illustrated by way of example only. It will be obvious to those skilled in the art that various changes and modifications may be made therein without departing from the scope of the invention as defined by the appended claims. For example, it the teachings of the invention may also be usable in connection with other forms of analog-to-digital converters, such as converters employing resistive networks instead of capacitive networks.

What is claimed is:

1. An analog-to-digital converter, comprising:
   an analog input node,
   a first charge redistribution analog-to-digital converter circuit having
      an analog input operatively connected to the analog input node and
      a parallel digital conversion result output, the parallel digital conversion result output including a plurality of output lines ranging from most significant to least significant, and
   a second charge redistribution analog-to-digital converter circuit having
      an analog input operatively connected to the analog input node,
   a parallel digital input, the parallel digital input including a plurality of input lines ranging from most significant to least significant, the most significant input lines of the parallel digital input of the second converter circuit being operatively connected to the most significant output lines of the parallel digital output of the first converter circuit, and
   a digital output.

2. The analog-to-digital converter of claim 1, wherein the first and second analog-to-digital converter circuits each have a reference input, and further including a first reference circuit having a first reference output operatively connected to the reference input of the first converter circuit, and a second reference circuit having a second reference output operatively connected to the reference input of the second converter circuit.

3. The analog-to-digital converter of claim 1, wherein the digital output of the second converter circuit comprises a plurality of parallel output lines and wherein ones of the output lines in the digital output are redundant, and further including a correction circuit having a digital data input operatively connected to the plurality of output lines, the correction circuit having a parallel digital data output with a corrected line corresponding to the redundant output lines of the second converter circuit.

4. The analog-to-digital converter of claim 3 wherein the correction circuit has a combinatorial transfer function.

5. The analog-to-digital converter of claim 1, wherein the second analog-to-digital converter comprises a comparator having a bandwidth adjustment circuit.

6. The analog-to-digital converter of claim 1, wherein the second analog-to-digital converter circuit further includes
   a first analog demultiplexer having a data input operatively connected to the analog input node, and first and second data outputs,
   a first sampling capacitor having a plate operatively connected to the first data output of the first analog demultiplexer,
   a second sampling capacitor having a plate operatively connected to the second data output of the first analog demultiplexer, a first analog multiplexer having a first data input operatively connected to the plate of the first sampling capacitor, a second data input operatively connected to the plate of the second sampling capacitor, and a data output, and further analog-to-digital conversion circuitry having an input operatively connected to the data output of the first analog multiplexer and an output operatively connected to the digital output of the second analog-to-digital converter circuit.

7. An analog-to-digital converter, comprising:

an analog input node, a first analog-to-digital converter circuit having an analog input operatively connected to the analog input node having a parallel digital conversion result output, and having a reference input, a second analog-to-digital converter circuit having an analog input operatively connected to the analog input node, having a parallel digital input operatively connected to the digital output of the first converter circuit, having a reference input, and having a digital output, a first reference circuit having a first reference output operatively connected to the reference input of the first converter circuit, a second reference circuit having a second reference output operatively connected to the reference input of the second converter circuit, and a reference analog multiplexer comprising a first data input operatively connected to the first reference output, a second data input operatively connected to the second reference output, and a data output operatively connected to the reference input of the second converter circuit, said analog multiplexer forming a portion of the operative connection between the second reference output and the reference input of the second converter circuit.

8. An analog-to-digital converter comprising:

an analog input node, a first analog-to-digital converter circuit having an analog input operatively connected to the analog input node and having a parallel digital conversion result output, a second analog-to-digital converter circuit having an analog input operatively connected to the analog input node, a parallel digital input operatively connected to the digital output of the first converter circuit, and a digital output, and wherein the second analog-to-digital converter circuit has a reference input, further including a first reference circuit having a first reference output, further including a second reference circuit having a second reference output, and further including a reference analog multiplexer comprising a first data input operatively connected to the first reference output, a second data input operatively connected to the second reference output, and a data output operatively connected to the reference input of the second converter circuit.

9. The analog-to-digital converter of claim 8, wherein the digital output of the second converter circuit comprises a plurality of parallel output lines and wherein ones of the output lines in the digital output are redundant, and further including a correction circuit having a digital data input operatively connected to the plurality of output lines, the correction circuit having a parallel digital data output with a corrected line corresponding to the redundant output lines of the second converter circuit.

10. The analog-to-digital converter of claim 9 wherein the correction circuit has a combinatorial transfer function.

11. The analog-to-digital converter of claim 8 wherein the first reference circuit is a first buffer, wherein the second reference circuit is a second buffer, and wherein the first and second buffers each have an input connected to a common reference voltage supply.

12. An analog-to-digital converter, comprising:

an analog input node, a first analog-to-digital converter circuit having an analog input operatively connected to the analog input node and having a parallel digital conversion result output, a second analog-to-digital converter circuit having an analog input operatively connected to the analog input node, a parallel digital input operatively connected to the digital output of the first converter circuit, and a digital output, and wherein the first analog-to-digital converter circuit includes a successive approximation register having control outputs, and having a data output operatively connected to the digital output of the first converter circuit, a first plurality of switches having control inputs operatively connected to the control outputs of the successive approximation register, and a first plurality of capacitors each operatively connected between one of the first plurality of switches and the analog input of the first converter analog-to-digital circuit; and the second analog-to-digital converter circuit includes a parallel load register having control outputs, and having a parallel load input operatively connected to the digital input of the second converter circuit, a second plurality of switches having control inputs operatively connected to the control outputs of the parallel load register, and a second plurality of capacitors each operatively connected between one of the second plurality of switches and the analog input of the second converter analog-to-digital circuit.

13. The analog-to-digital converter of claim 12, further including a first reference circuit having a first reference output operatively connected to the first plurality of switches, and a second reference circuit having a second reference output operatively connected to the second plurality of switches.

14. The analog-to-digital converter of claim 13, further including a reference analog multiplexer comprising a first data input operatively connected to the first reference output, a second data input operatively connected to the second reference output, and a data output operatively connected to the second plurality of switches, said analog multiplexer forming a portion of the operative connection between the second reference output and the second plurality of switches.

15. The analog-to-digital converter of claim 12, further including a first reference circuit having a first reference output, further including a second reference circuit having a second reference output, and further including a reference analog multiplexer comprising a first data input operatively connected to the first reference output, a second data input operatively connected to the second reference output, and a data output operatively connected to the second plurality of switches.

16. The analog-to-digital converter of claim 15, wherein the digital output of the second converter circuit comprises a plurality of parallel output lines each corresponding to ones of the capacitors in the second plurality of capacitors, wherein ones of capacitors in the second plurality of capacitors and corresponding ones of the output lines in the digital output are redundant, and further including a correction circuit having a digital data input operatively connected to the plurality of output lines, the correction circuit having a parallel digital data output with a corrected line corresponding to the redundant output lines of the second converter circuit.

17. The analog-to-digital converter of claim 16 wherein the correction circuit has a combinatorial transfer function.

18. The analog-to-digital converter of claim 12, wherein the digital output of the second converter circuit comprises a plurality of parallel output lines each corresponding to ones of the capacitors in the second plurality of capacitors, wherein ones of capacitors in the second plurality of capacitors and corresponding ones of the output lines in the digital output are redundant, and further including a correction circuit having a digital data input operatively connected to the plurality of output lines, the correction circuit having a parallel digital data output with a corrected line corresponding to the redundant output lines of the second converter circuit.

19. The analog-to-digital converter of claim 18 wherein the correction circuit has a combinatorial transfer function.

20. An analog-to-digital conversion method, comprising the steps of:

performing a coarse charge redistribution analog-to-digital conversion of an analog signal to a coarse digital representation of the analog signal using a first charge redistribution analog-to-digital converter, transferring the coarse digital representation obtained in the step of performing a coarse conversion to a second charge redistribution analog-to-digital converter, and performing a fine charge redistribution analog-to-digital conversion of the analog signal to a fine digital representation of the analog signal using the second converter, the step of performing a fine analog-to-digital conversion employing the most significant bits of the coarse digital representation as a starting value for the most significant bits of the fine digital representation.

21. The method of claim 20, wherein the step of performing a fine conversion includes a conversion step portion that is redundant with a conversion step portion of the step of performing a coarse conversion, and further including a step of correcting a mismatch between the coarse conversion and the fine conversion according to results of the redundant conversion step portions.

22. The method of claim 21, wherein the step of correcting includes combining the results of the redundant conversion step portions according to a combinatorial transfer function.

23. The method of claim 21, wherein the step of correcting includes adding the results of the redundant conversion step portions, and subtracting an offset value from a result of a further conversion step portion.

24. The method of claim 20, wherein the step of performing a fine conversion includes a step of comparing an amount of charge in a sampling capacitor, and wherein the step of comparing begins after the step of performing a coarse conversion.

25. An analog-to-digital converter, comprising:

a switched divider network having an analog input operatively connected to an analog input node, having a digital switch control input, and having an output, a comparator having an analog input operatively connected to the output of the network, and having a digital output, a first control circuit having a digital input operatively connected to the digital output of the comparator, and having a digital output operatively connected to the switch control input of the switched divider network, and a bandwidth adjustment circuit operatively connected to the comparator circuit.

26. The analog-to-digital converter of claim 25 wherein the comparator includes a signal path operatively connected to the input of the comparator, and the bandwidth adjustment circuit includes a capacitor and a switch operatively connected between the capacitor and the signal path in the comparator.

27. The analog-to-digital converter of claim 25 wherein the comparator includes a signal path operatively connected to the input of the comparator, and the bandwidth adjustment circuit includes a plurality of capacitors and a plurality of switches, each of the capacitors being in series with one of the switches, and each of he switches being operatively connected to the signal path in the comparator.

28. The analog-to-digital converter of claim 25 wherein the switched divider network includes a generally binary-weighted capacitive ladder network having a predetermined number of capacitors each operatively connected to one of a plurality of switches, and further including a second control circuit for activating the bandwidth adjustment circuit before the first control circuit provides a control signal on its digital output to switch a predetermined one of the switches.

29. The analog-to-digital converter of claim 25, further comprising a first analog demultiplexer having a data input operatively connected to the analog input node, and first and second data outputs, a first sampling capacitor having a plate operatively connected to the first data output of the first analog demultiplexer, a second sampling capacitor having a plate operatively connected to the second data output of the first analog demultiplexer, a first analog multiplexer having a first data input operatively connected to the plate of the first sampling capacitor, a second data input operatively connected to the plate of the second sampling capacitor, and a data output operatively connected to the analog input of the switched divider network.

30. An analog-to-digital conversion method, comprising the steps of:

performing a coarse analog-to-digital conversion of an analog signal to a coarse digital representation of the analog signal using a first analog-to-digital converter, transferring the coarse digital representation obtained in the step of performing a coarse conversion to a second analog-to-digital converter, performing a fine analog-to-digital conversion of the analog signal to a fine digital representation of the analog signal using the second converter, the step of performing a fine analog-to-digital conversion employing the coarse digital representation as a starting value for the fine digital representation, and wherein the step of performing a fine conversion employs an electrical reference provided from either a coarse or a fine reference source, and further including the step of switching from providing the electrical reference from the coarse reference to providing the electrical reference from the fine reference after the step of transferring the coarse digital representation.

31. The method of claim 30 further including a first step of buffering a common reference voltage supply by the coarse reference source to obtain the coarse reference and a second step of buffering the common reference voltage supply by the fine reference source to obtain the fine reference.

32. An analog-to-digital conversion method comprising the steps of:

converting an analog signal to a digital representation having a first resolution level, with a converter circuit, adjusting a bandwidth of the converter circuits, continuing to convert the analog signal to a second resolution level that is higher than the first resolution level with the converter circuit after the bandwidth of the converter has been adjusted in the step of adjusting, and wherein the steps of converting and continuing to convert each include a comparison step performed by a comparator circuit, and wherein the adjusting step adjusts a bandwidth of the comparator circuit.

33. An analog-to-digital converter, comprising:

an analog input node, a first analog demultiplexer having a data input operatively connected to the analog input node, and first and second data outputs, a first sampling capacitor having a plate operatively connected to the first data output of the first analog demultiplexer, a second sampling capacitor having a plate operatively connected to the second data output of the first analog demultiplexer, a first analog multiplexer having a first data input operatively connected to the plate of the first sampling capacitor, a second data input operatively connected to the plate of the second sampling capacitor, and a data output, an analog-to-digital conversion circuit having an input operatively connected to the data output of the first analog multiplexer, and an input amplifier having a signal input operatively connected to the analog input node, having a signal output operatively connected to the data input of the first demultiplexer, having a feedback input, and wherein the amplifier forms a part of the operative connection between the analog input node and the data input of the first demultiplexer, and a second analog multiplexer having a first data input operatively connected to the plate of the first sampling capacitor, having a second data input operatively connected to the plate of the second sampling capacitor, and having a data output operatively connected to the feedback input of the input amplifier.

34. The analog-to-digital converter of claim 33, wherein the analog-to-digital conversion circuit is a charge redistribution analog-to-digital conversion circuit that includes a comparator operatively connected to the input of the analog-to-digital conversion circuit, the comparator including a first channel input stage having an input operatively connected to the first sampling capacitor and an output, a second channel input stage having an input operatively connected to the second sampling capacitor and an output, and a third analog multiplexer having a first data input operatively connected to the output of the first channel input stage and a second data input operatively connected to the output of the second channel input stage.

35. The analog-to-digital converter of claim 33 further including a first channel follower buffer having an input directly connected to the first data output of the first analog demultiplexer and having an output directly connected to the plate of the first sampling capacitor, a second channel follower buffer having an input directly connected to the second data output of the first analog demultiplexer and having an output directly connected to the plate of the second sampling capacitor, a first grounding switch directly connected between the output of the first channel follower buffer and ground, and a second grounding switch directly connected between the output of the second channel follower buffer and ground.

36. The analog-to-digital of claim 35 wherein the first and second follower buffers each include a bandwidth limiting output resistor.

37. An analog-to-digital conversion method, comprising the steps of:

tracking an analog signal with a first sampling capacitor, evaluating the amount of charge stored in a second sampling capacitor during the step of tracking with the first sampling capacitor by successively testing the charge stored in the second sampling capacitor with ones of a plurality of further capacitors from a capacitor array to determine the amount of the charge stored in the second sampling capacitor by directly transferring charge between the first sampling capacitor and the capacitors of the capacitor array, tracking the analog signal with the second sampling capacitor, and evaluating the amount of charge stored in the first sampling capacitor during the step of tracking with the second sampling capacitor by successively testing the charge stored in the first sampling capacitor with ones of the plurality of further capacitors from the capacitor array to determine the amount of the charge stored in the first sampling capacitor by directly transferring charge between the second sampling capacitor and the capacitors of the capacitor array.

38. The method of claim 37 wherein the step of evaluating the amount of charge in the first capacitor includes a first step of comparing performed in part by a first comparator input stage, and wherein the step of evaluating the amount of charge in the second capacitor includes a second step of comparing performed in part by a second comparator input stage.

39. The method of claim 37 further including a step of multiplexing the analog signal between the first and second sampling capacitors, wherein analog-to-digital conversion circuitry performs the evaluating steps, and further including a step of multiplexing the analog-to-digital conversion circuitry between the sampling capacitors.

40. Analog-to-digital conversion means, comprising:

means for performing a coarse charge redistribution, analog-to-digital conversion of an analog signal to a coarse digital representation of the analog signal, means for performing a fine charge redistribution analog-to-digital conversion of the analog signal to a fine digital representation of the analog signal by employing the most significant bits of the coarse digital representation as a starting value for the most significant bits of the fine digital representation, and means for transferring the coarse digital representation from the means for performing a coarse conversion to the means for performing a fine conversion.

41. The analog-to-digital conversion means of claim 40, wherein the means for performing a fine conversion includes means for performing a conversion portion that is redundant with a conversion portion of the coarse conversion, and further including means for correcting a mismatch between the coarse conversion and the fine conversion according to results of the redundant conversion portions.

42. The analog-to-digital conversion means of claim 41, wherein the means for correcting include means for combining the results of the redundant conversion portions according to a combinatorial transfer function.

43. The analog-to-digital conversion means of claim 41, wherein the means for correcting includes means for adding the results of the redundant conversion portions, and means for subtracting an offset value from a result of a further conversion portion.

44. An analog-to-digital conversion means, comprising:

means for performing a coarse analog-to-digital conversion of an analog signal to a coarse digital representation of the analog signal, means for performing a fine analog-to-digital conversion of the analog signal to a fine digital representation of the analog signal by employing the coarse digital representation as a starting value for the fine digital representation, means for transferring the coarse digital representation from the means for performing a coarse conversion to the means for performing a fine conversion, and wherein the means for performing a fine conversion employs an electrical reference provided from either a coarse or a fine reference source means, and further including means for switching from providing the electrical reference from the coarse reference means to providing the electrical reference from the fine reference means.

45. Analog-to-digital conversion means, comprising:

means for converting an analog signal to a digital representation having a first resolution level, means for adjusting a bandwidth of the means for converting, means for continuing to convert the analog signal to a second resolution level that is higher than the first resolution level after the bandwidth of the means for converting has been adjusted by the means for adjusting, wherein the means for converting and continuing to convert each include means for comparing and wherein the means for adjusting is for adjusting a bandwidth of the means for comparing.

46. An analog-to-digital converter, comprising:

an analog input node, a sampling capacitor operatively connected to the analog input node, a first charge redistribution analog-to-digital converter portion, including a first control register having control outputs, a first plurality of switches having control inputs operatively connected to the control outputs of the control register, and a first plurality of binary-weighted capacitors each operatively connected to one of the first plurality of switches and the sampling capacitor, the capacitors in the first plurality ranging in size from a most significant to a least significant, and a second charge redistribution analog-to-digital converter portion, including a second control register having control outputs, a second plurality of switches having control inputs operatively connected to the control outputs of the second control register, a second plurality of binary-weighted capacitors each operatively connected to one of the second plurality of switches and the sampling capacitor, the capacitors in the second plurality ranging in size from a most significant to a least significant, and wherein the most significant capacitor in the second plurality of capacitors is redundant with the least significant capacitor in the first plurality of capacitors, and a correction circuit having a digital output with a first corrected line corresponding to the least significant capacitor in the first plurality of capacitors and to the most significant capacitor in the second plurality of capacitors.

47. The analog-to-digital converter of claim 46 wherein the correction circuit has a combinatorial transfer function.

48. The analog-to-digital converter of claim 46, further comprising:

a third charge redistribution analog-to-digital converter portion, including:

a third control register having control outputs, a third plurality of switches having control inputs operatively connected to the control outputs of the third control register, a third plurality of binary-weighted capacitors each operatively connected to one of the third plurality of switches and the sampling capacitor, the capacitors in the third plurality ranging in size from a most significant to a least significant, and wherein the most significant capacitor in the third plurality of capacitors is redundant with the least significant capacitor in the second plurality, and wherein the digital output of the correction circuit has a second corrected line corresponding to the least significant capacitor in the second plurality and the most significant capacitor in the third plurality of capacitors.

49. An analog-to-digital conversion method, comprising the steps of:

sampling an analog signal by storing a quantity of charge derived from the analog signal, performing a first portion of a charge redistribution analog-to-digital conversion of an analog signal to a first plurality of bits of a digital representation of the analog signal by successively testing the quantity of charge stored in the step of sampling, using a first plurality of capacitors, performing a second portion of the charge redistribution analog-to-digital conversion of the analog signal to a further plurality of bits of the digital representation of the analog signal by further successively testing the quantity of charge stored in the step of sampling, using a second plurality of capacitors, wherein one of the steps of testing the quantity of charge with the second plurality of capacitors is redundant with one of the steps of testing the quantity of charge with the first plurality of capacitors, and correcting a mismatch between results of the step of performing a first portion of the charge redistribution analog-to-digital conversion and results of the step of performing a second portion of the charge redistribution analog-to-digital conversion, according to results of the redundant steps of testing the quantity of charge with the first and second pluralities of capacitors.

50. The method of claim 49, wherein the step of correcting includes combining the results of the redundant conversion step portions according to a combinatorial transfer function.

51. The method of claim 49 further comprising the step of performing a third portion of the charge redistribution analog-to-digital conversion of the analog signal to yet a further plurality of bits of the digital representation of the analog signal by still further successively testing the quantity of charge stored in the step of sampling, using a third plurality of capacitors, wherein one of the steps of testing the quantity of charge with the third plurality of capacitors is redundant with one of the steps of testing the quantity of charge with the second plurality of capacitors, and correcting a mismatch between results of the step of performing a second portion of the charge redistribution analog-to-digital conversion and results of the step of performing a third portion of the charge redistribution analog-to-digital conversion, according to results of the redundant steps of testing the quantity of charge with the second and third pluralities of capacitors.

* * * * *